US009348619B1

(12) United States Patent
Lysaght et al.

(10) Patent No.: US 9,348,619 B1
(45) Date of Patent: May 24, 2016

(54) INTERACTIVE DATASHEET SYSTEM

(71) Applicant: Xilinx, Inc., San Jose, CA (US)

(72) Inventors: Patrick Lysaght, Los Gatos, CA (US); Paul R. Schumacher, Berthoud, CO (US); Graham F. Schelle, Longmont, CO (US); Yi-Hua Yang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 316 days.

(21) Appl. No.: 13/797,721

(22) Filed: Mar. 12, 2013

(51) Int. Cl.
    *G06G 7/62*     (2006.01)
    *G06F 9/455*     (2006.01)

(52) U.S. Cl.
    CPC ...................... *G06F 9/455* (2013.01)

(58) Field of Classification Search
    CPC ............ G06F 17/5045; G06F 17/5022; G06F 2217/04; G06F 17/50; G06F 2217/66; G06F 11/261; G06F 17/5027; G06F 17/5031; G06F 17/5054; G06F 2217/02; G06F 11/26; G06F 11/3664; G06F 11/3672; G06F 17/305
    USPC .................. 703/13, 14, 15, 23, 28, 22, 26
See application file for complete search history.

(56) References Cited

U.S. PATENT DOCUMENTS

| | | | | |
|---|---|---|---|---|
| 6,389,379 | B1 * | 5/2002 | Lin et al. ......................... | 703/14 |
| 7,072,818 | B1 * | 7/2006 | Beardslee et al. .............. | 703/14 |
| 2003/0217296 | A1 * | 11/2003 | Ma ........................ | G06F 1/3203 713/300 |
| 2006/0230317 | A1 * | 10/2006 | Anderson ........................ | 714/38 |
| 2008/0244135 | A1 * | 10/2008 | Akesson ............. | G06F 13/1626 710/241 |
| 2010/0057415 | A1 * | 3/2010 | Chu et al. .......................... | 703/6 |

OTHER PUBLICATIONS

Pimentel (A Systematic Approach to Exploring Embedded System Architectures at Multiple Abstraction Levels, IEEE Transactions on Computers, vol. 55, No. 2, Feb. 2006).*
Moss (Recent Experience on an ESL Framework for Rapid Design Exploration using Hardware-Software Codesign for ARM based FPGAs, Space Codesign, MPSoC'12, Jul. 2012).*
Cortex-A9 (Cortex-A9 Revision: r2p0, Technical Reference Manual, ARM, 2008).*
UG786 (Power Methodology Guide (V13.1), Xilinx Inc., Mar. 1, 2011).*
Rajagopalan (Xilinx Zynq-7000 EPP: An Extensible Processing Platform Family, Aug. 18, 2011).*
Schumacher (Fast and Accurate Resource Estimation of RTL-Based Designs Targeting FPGAs, IEEE 2008).*

(Continued)

*Primary Examiner* — Carlos Ortiz Rodriguez
*Assistant Examiner* — Brian S Cook
(74) *Attorney, Agent, or Firm* — LeRoy D. Maunu

(57) ABSTRACT

A user interface is provided for selection of a previously specified scenario from a plurality of previously specified scenarios. Each previously specified scenario includes a previously specified topology of the electronic system, one or more previously specified parameter values applied to the electronic system, a previously specified traffic profile, and respective precompiled values of one or more measurands. In response to user selection of one of the previously specified scenarios, the precompiled values of the measurands are displayed. The user interface further provides for specification of a scenario. In response to user specification of a scenario, traffic emulation circuitry in the programmable IC is configured to execute the scenario. The value of the at least one measurand is computed and displayed.

19 Claims, 9 Drawing Sheets

(56) References Cited

OTHER PUBLICATIONS

Brebner, G., An Interactive Datasheet for the Xilinx XC6200, From FPGA to Computing Paradigm, 8th International Workshop, FPL 1998. Proceedings Springer-Verlag. 198, pp. 401-5 [79]N.*
Schumacher, P., Fast FPGA Resource Estimation, Xilinx Inc., Design Automation Conference 2009.*
Fischer, G., Supporting Software Designers with Integrated Domain-Oriented Design Environments, IEEE Transactions on Software Engineering, vol. 18, No. 6, Jun. 1992.*
Wolf, W., Hardware-Software Co-Design of Embedded Systems, Proceedings of the IEE, vol. 82, No. 7, Jul. 1994.*
Gohringer, D., Exploration of the Power-Performance Tradeoff through Paramaterization of FPGA-Based Multi-processor Systems, Hindawi Publishing Corporation International Journal of Reconfigurable Computing vol. 2011, Article ID 985931, 17 pages doi: 10.1155/2011/985931.*
Demler, M., Virtual or real: Prototyping platform(s) for ARM-based FPGA design, DSP-FPGA.com, Dec. 6, 2011.*
Getman, L., Creating the Xilinx Zynq-7000 Extensible Processing Platform, EE times.com, Oct. 17, 2011.*
Maxfield, C., Xilinx to demo Zynq-7000 EPP SW/HW development tools at ARM TechCon 2011, Oct. 20, 2011.*
Cadence Design Systems, Cadence Virtual System Platform for the Xilinx Zynq-7000 all Programmable Soc: An extensible virtual platform for faster embedded software development 2012.*
DS769 (LogiCORE IP ACI Slave Burst, Product Specification Datasheet, Jun. 22, 2010).*
Gulati (Modeling workloads and devices for IO load balancing in virtualized environments, ACM SIGMETRICS Performance Evaluation Review, v.37 n. 3, Dec. 2009 [doi>10.1145/1710115. 1710127]).*
Ahmad (Easy and Efficient Disk I/O Workload Characterization in VMware ESX Server, IEEE 2007).*
DeHaven, K., Extensible Processing Platform Ideal Solution for a Wide Range of Embedded Systems, Xilinx White Paper: Extensible Processing Platform, WP369 (V1.0) Apr. 27, 2010.*
Mammeri, N., Fast SoC Architecture Exploration Using Traffic Simulation Techniques, DVClub Apr. 2010: Verification of re-used Design IP, Apr. 30, 2010, Bristol, Cambridge and Eindhoven.*
Mshahbaz, AXI4 Stream Generator and Checker, https://github.com/NetFPGA/NetFPGA-public/wiki/AXI4-Stream-Generator-and-Checker, Jul. 15, 2012.*
Edu-Kinect, Performance Analysis, AXI Performance Monitor, Oct. 15, 2012 http://webcache.googleusercontent.com/search?q=cache:TWPzhlpjEnYJ:www.edu-kinect....*
Carbon, News Release, Carbon Adds AXI Analysis Capabilities to SoC Designer Plus, May 25, 2011.*
U.S. Appl. No. 13/398,790, filed Feb. 16, 2012, Schumacher et al.
ARM, *Cortex-A9 Technical Reference Manual,* Revision r2p2, Apr. 30, 2010, Section 11.2, pp. 11-3 to 11-6, ARM, Cambridge, United Kingdom.
Intel Corp., *Intel Xeon Processor 7500 Series Uncore Programming Guide,* Ref. No. 323535-001, Mar. 2010, pp. 2-6, 2-17 to 2-18, 2-35 to 2-36, 2-53 to 2-54, 2-88, 2-110 to 2-111, and 2-128, Intel Corporation, Denver, Colorado, USA.
Xilinx, Inc., *Zynq-7000 All Programmable SoC Overview,* DS190 (v1.2), Aug. 21, 2012, pp. 1-21, Xilinx, Inc., San Jose, California, USA.
Xilinx, Inc., *Zynq-7000 All Programmable SoC Technical Reference Manual,* UG585 (v1.4), Nov. 16, 2012, 2012, pp. 246-282, Xilinx, Inc., San Jose, California, USA.

* cited by examiner

INTERACTIVE DATASHEET SYSTEM

TECHNICAL FIELD

The disclosure generally relates to estimating performance of systems implemented on a programmable integrated circuit (IC).

BACKGROUND

The programmable resources of programmable logic devices (PLDs) are being combined with both general purpose and dedicated purpose hardware to make complex system-on-chips (SOCs). PLDs are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), general purpose processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Some FPGA-based SOCs are general-purpose devices. An example of a general purpose SOC is the Zynq SOC from XILINX, Inc. These SOCs are not designed for any particular application and may be deployed in a wide variety of different applications. In contrast, other SOCs are designed for particular applications. With a particular application in mind, a designer knows exactly what functionality and performance they are targeting during the design process and can evaluate and compare competing application-targeted SOCs accordingly.

A part of the design process is for the application designer to select a particular SOC on which the system is to be deployed. There may be a number of competing SOCs, each having particular advantages and disadvantages. The suppliers of such SOCs can provide datasheets that show estimated performance levels for various system metrics. For application-targeted SOCs, there may be a limited number of configuration parameters or options that affect the performance levels since the SOCs are targeted to a particular application domain. This allows the providers of application-targeted SOCs to readily provide information useful to the designer. However, for general purpose SOCs, there may be a multitude of configuration parameters and hardware options since each application domain may call for a different configuration. Also, there may be several valid configurations for one application which may or may not differ in performance. In this instance, it is highly impractical to produce system-level performance specifications for all deployment scenarios of such general purpose SOCs. Since there is effectively an n-dimensional measurement space, it is impractical to provide a comprehensive datasheet that would give potential customers insights into the performance of the SOC for every possible configuration.

SUMMARY

A method of estimating performance of an electronic system on a programmable integrated circuit (IC) includes providing a user interface for selection of a previously specified scenario from a plurality of previously specified scenarios. Each previously specified scenario includes a previously specified topology of the electronic system, one or more previously specified parameter values applied to the electronic system, a previously specified traffic profile, and respective precompiled values of one or more measurands. In response to user selection of one of the previously specified scenarios, the respective precompiled values of the one or more measurands are displayed. The user interface further provides for specification of a scenario, including specification of a topology of the electronic system, specification of one or more parameter values to apply to the electronic system, specification of a traffic profile, and selection of at least one measurand. In response to user specification of a scenario, traffic emulation circuitry in the programmable IC is configured to execute the scenario. The system is emulated with the traffic emulation circuitry configured to execute the scenario. The emulating includes generating stimuli and measuring responses for determining a value of the at least one measurand. The value of the at least one measurand is computed and displayed.

A system of estimating performance of an electronic system on a programmable integrated circuit (IC) includes an emulation platform including a programmable IC, one or more processors coupled to the emulation platform, and a memory coupled to the one or more processors. The memory is configured with instructions that when executed by the one or more processors cause the one or more processors to perform operations including providing a user interface for selection of a previously specified scenario from a plurality of previously specified scenarios. Each previously specified scenario includes a previously specified topology of the electronic system, one or more previously specified parameter values applied to the electronic system, a previously specified traffic profile, and respective precompiled values of one or more measurands. In response to user selection of one of the previously specified scenarios, the respective precompiled values of the one or more measurands are displayed. The user interface further provides for specification of a scenario, including specification of a topology of the electronic system, specification of one or more parameter values to apply to the electronic system, specification of a traffic profile, and selection of at least one measurand. In response to user specification of a scenario, traffic emulation circuitry in the programmable IC is configured to execute the scenario. The emulation platform is configured to emulate the system with the traffic emulation circuitry configured to execute the scenario. The emulating includes generating stimuli and measuring responses for determining a value of the at least one measurand. The operations performed by the processor further include computing and outputting the value of the at least one measurand.

Other features will be recognized from consideration of the Detailed Description and Claims, which follow.

BRIEF DESCRIPTION OF THE DRAWINGS

Various aspects of the disclosed method and system will become apparent upon review of the following detailed description and upon reference to the drawings, in which.

DETAILED DESCRIPTION

Figure 2:
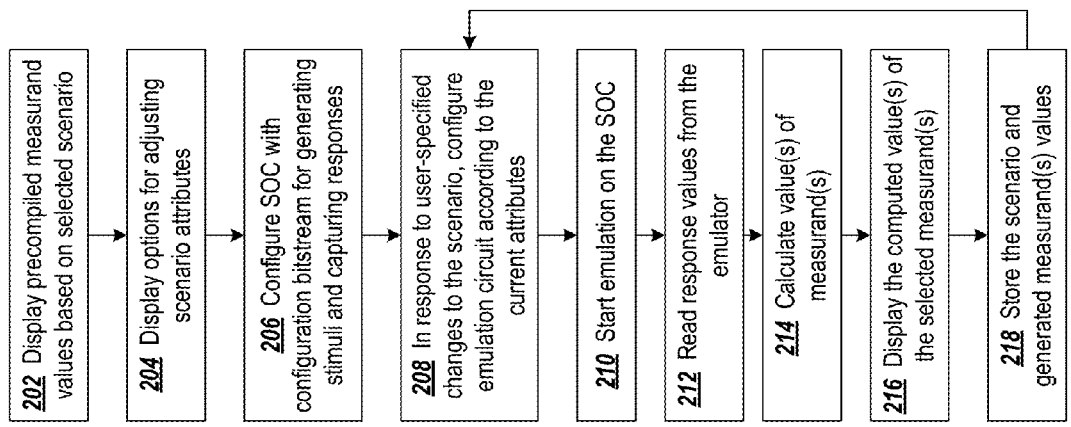
FIG. 2 is a flowchart of a process for estimating the performance of an electronic system implemented on a programmable IC.

In some general purpose SOCs, the number of possible combinations of elements that are configurable, permutations of configuration parameters applied to those elements, and different traffic patterns is too large to feasibly provide pre-compiled performance metrics for each individual combination. An interactive datasheet is provided to give visibility to performance metrics of such SOCs. The interactive datasheet provides pre-compiled performance metrics for previously specified scenarios and allows a designer to modify the scenario to view performance metrics of the SOC for an application-specific scenario. The previously specified scenarios are a limited subset of the different combinations of configurable elements, values of configuration parameters and traffic patterns. Where a user desires a scenario that is more closely aligned with the intended application, the interactive datasheet allows the user to select configurable elements, the values of configuration parameters, and the traffic pattern for the scenario. The interactive datasheet then configures an SOC with software and emulation circuitry for determining the performance metrics for the user's scenario. The user may also select which performance metric(s) for which the scenario is to be performed.

The interactive datasheet divides the variables of the measurement space over which SOC performance may be evaluated into four categories or subsets. A first category contains variables that describe the topology of the system; a second category contains variables that specify the parameter values of the system and interfaces; a third category of variables describes the traffic profile; and a fourth category includes the measurands. The topology variables indicate the interfaces to be used. For example, in the Zynq SOC, interfaces may be used for DDR2, DDR3, LPDDR2, NAND flash, Quad-SPI flash, parallel data bus, parallel NOR flash interface, PCIe, Ethernet, USB, CAN bus SD/SDIO, SPI, UART, I2C, processor-to-programmable logic, select I/O resources, and GPIO.

The parameters include those variables to which values can be assigned for different elements of the SOC and elements of the topology. For example, parameters may include bit-width (s), clock frequencies, the priority a DDR is to give to requests from different interfaces, the issuance rate for a master on a select I/O interface, and a quality-of-service (QoS), for example.

The variables for the traffic profile describe the requests to be transmitted over the interfaces in the scenario. For example, the variables may specify the ratio of read transactions to write transactions, an addressing mode of the transactions (linear or random), desired data rates for the traffic, the burstiness of read/write transactions, and the software to be executed in the scenario (such as an application, test bench, or operating system). The traffic profile may further specify whether memory requests are between a processor and memory, between two memories, between memory and a peripheral, between programmable logic and memory, or are scatter-gather.

The measurands are the performance metrics for which the user desires the SOC to be evaluated. Example measurands include read latencies, write latencies, channel utilization, throughput, power consumption, CPU utilization, cache miss rates, mistaken predictions of branches, etc.

While the "all programmability" of general purpose SOCs makes assembling a comprehensive datasheet unfeasible, the all programmability enables self-instrumenting of the device for many scenarios. Self-instrumenting refers to configuring the SOC according to a particular scenario and measuring performance of the SOC with circuitry implemented on the SOC. For SOCs with heterogeneous, programmable computing resources, programmable interconnect and shared resources such as memory (on-chip caches and/or external DDR memory), the possible system configurations are numerous and have a large number of configurable options, which may result in highly unpredictable system-level performance and may be unfeasible to model accurately in software. Also, components such as memory controllers (e.g., DRAM controllers) are major components of SOCs and their performance is difficult to predict when deployed as a shared resource. Self-instrumentation coupled with traffic emulation is an advantageous and cost effective approach to estimating system-level performance.

Figure 1:
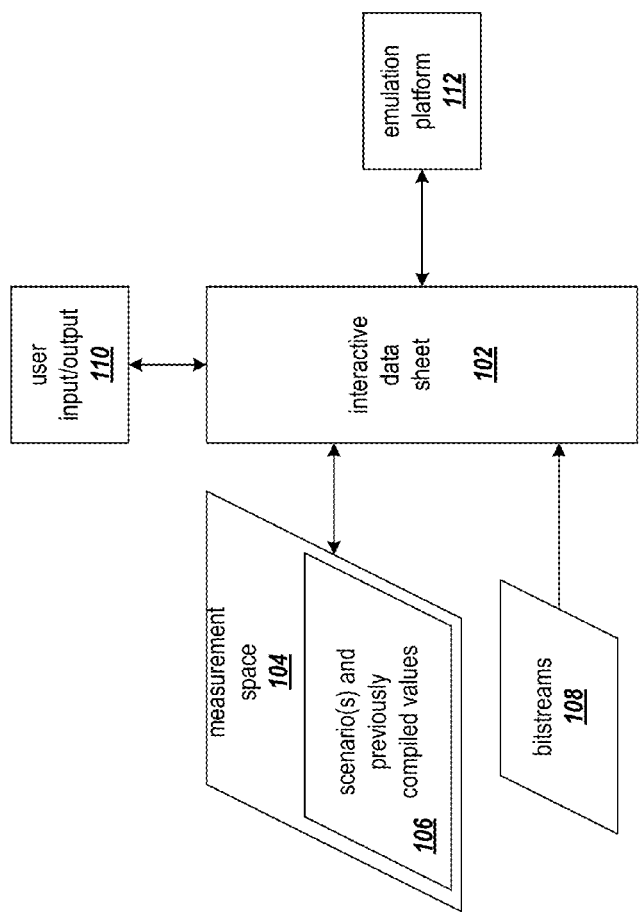
FIG. 1 shows an example system for estimating the performance of an electronic system implemented on an SOC.

FIG. 1 shows an example system for estimating the performance of an electronic system implemented on an SOC. The interactive datasheet 102 provides a user interface for selecting and/or specifying scenarios that reflect the expected configuration and operation of an electronic system to be implemented on the SOC. The measurement space 104 includes the variables that are relevant in determining particular performance metrics for the electronic system. The measurement space includes variables for the topology, parameters, traffic profiles, and measurands. The measurement space further includes previously specified scenarios and precompiled measurand values 106 that are available for user selection and inspection. The previously specified scenarios include previously specified topologies, previously specified parameter values, and previously specified traffic profiles, along with values of measurands corresponding to the previously specified topologies, parameter values, and traffic profiles.

One or more bitstreams 108 can be used to configure the emulation platform for stimulus generation and response monitoring for user-specified topologies, parameter values, and traffic profiles. User input 110, directs the interactive datasheet to either display the precompiled values of measurands for a previously specified scenario, or compute values for measurands for a scenario that is different from any of the previously specified scenarios. In response to user selection of a scenario for which measurand values were previously compiled, the previously compiled values may be read from a database 106 of scenario definitions and associated measurand values. Alternatively, or in addition to selecting the display of previously compiled measurand values for a selected scenario, the user input may modify any of the variables for the topology, parameters, or traffic profile, or specify a measurand(s) that has not yet been computed. Another option allows the user to revalidate the results of a previously specified scenario. That is, instead of displaying the previously compiled measurand values for a previously specified scenario, the measurand values are recomputed for the scenario using an emulation platform configured for the topology, parameter values, traffic profile for the scenario. This allows a user to revalidate not only the user's scenarios, but also those provided from other sources, such as the SOC provider.

In response to user input that specifies a scenario that includes a combination of topology, parameter values, traffic profile, and measurand that is not the same as the topology, parameter values, traffic profile, and measurand of a previously specified scenario, the interactive datasheet 102 configures the emulation platform 112 with a bitstream 108 and configuration values according to the specified scenario. The emulation platform includes an SOC (not shown), and the bitstream includes software for executing on a programmable processor (not shown) on the SOC and configuration data for programming programmable logic, programmable routing, and programmable I/O resources on the SOC. The software and circuitry configured on the SOC generate traffic on the defined interfaces according to topology, parameter, and traffic profile variables. In addition, the software and circuitry configured on the SOC measure responses needed for computing the measurands designated in the scenario. Measured data is read from the emulation platform by the interactive datasheet, and measurand values are computed and output for viewing by the user. The computed measurand values may also be stored back in the database 106 and associated with the user modified (or specified scenario). Thus, the next time that the user, or another user, wants to view those measurands for that scenario, the measurand values may be read from the database and emulation would not be required. The accumulation of scenarios and measurand values in the database may be employed in a crowd-sourcing manner to generate measurand values from a wide variety of scenarios by many different users.

In another implementation, the emulation may be performed on an emulation platform that does not include an SOC. Rather, the emulation platform may include an FPGA, and a register transfer language (RTL) emulation may be performed using the resources of the FPGA for emulating the SOC and the scenario. FIG. 2 is a flowchart of a process for estimating the performance of an electronic system implemented on a programmable IC. At block 202, in response to user selection of a scenario for which measurand values were previously compiled, precompiled measurand values are displayed for the selected scenario. As an option, the interactive datasheet may initiate a sweep of multiple runs that analyzes the performance/power of the system while changing selected topology, parameter, and traffic profile variables. The purpose of a parameter sweep is to show how a specific parameter directly affects the performance of a system. For example, for an N-bit priority register for a memory interface, 0 to $2^N-1$ may be the values used for the parameter, a test may be run with each value, and the performance analyzed across this range.

At block 204, options are displayed for changing scenario attributes. That is, the user interface provides the user with the capability to change topology, parameter, and traffic profile variables, as well as the capability to select measurands. The SOC is configured at block 206 with a configuration bitstream for generating stimuli and measuring responses. The bitstream configures software to execute on a processor and a circuit in programmable resources of the SOC. At block 208, the interactive datasheet further configures the SOC with data that indicates the user-specified variables for the topology, parameters, traffic profile, and measurands. A user-selectable option of block 204 allows the user to revalidate the results of a previously specified scenario. Instead of changing attributes of the a previously specified scenario, the user selects the previously specified scenario and specifies that the scenario should be re-executed on the SOC. The processing then continues as described above for blocks 206 and 208.

Emulation is started on the SOC at block 210. The software and circuitry generate traffic on selected interfaces as specified by the topology, parameter, and traffic profile variables. In addition, the software and circuitry measures or captures responses for the designated measurands. At block 212, the interactive datasheet reads the response value(s) from the SOC, and at block 214 the value(s) of the measurand(s) is calculated, if necessary. Depending on the measurand and the capabilities of the software and circuitry on the SOC, the value(s) of the measurand(s) may be provided directly from the SOC. The computed value(s) of the measurand(s) is then displayed to the user at block 216. The generated measurand (s) value(s) and associated scenario may be stored in a database at block 218. Subsequent users may then reference the specified scenario and the newly generated measurand(s) value(s) without having to emulate. If the database is widely shared, the generated scenarios and respective measurand sets may be much more robust than if the scenarios and measurand sets were generated by a single party.

Figure 3:
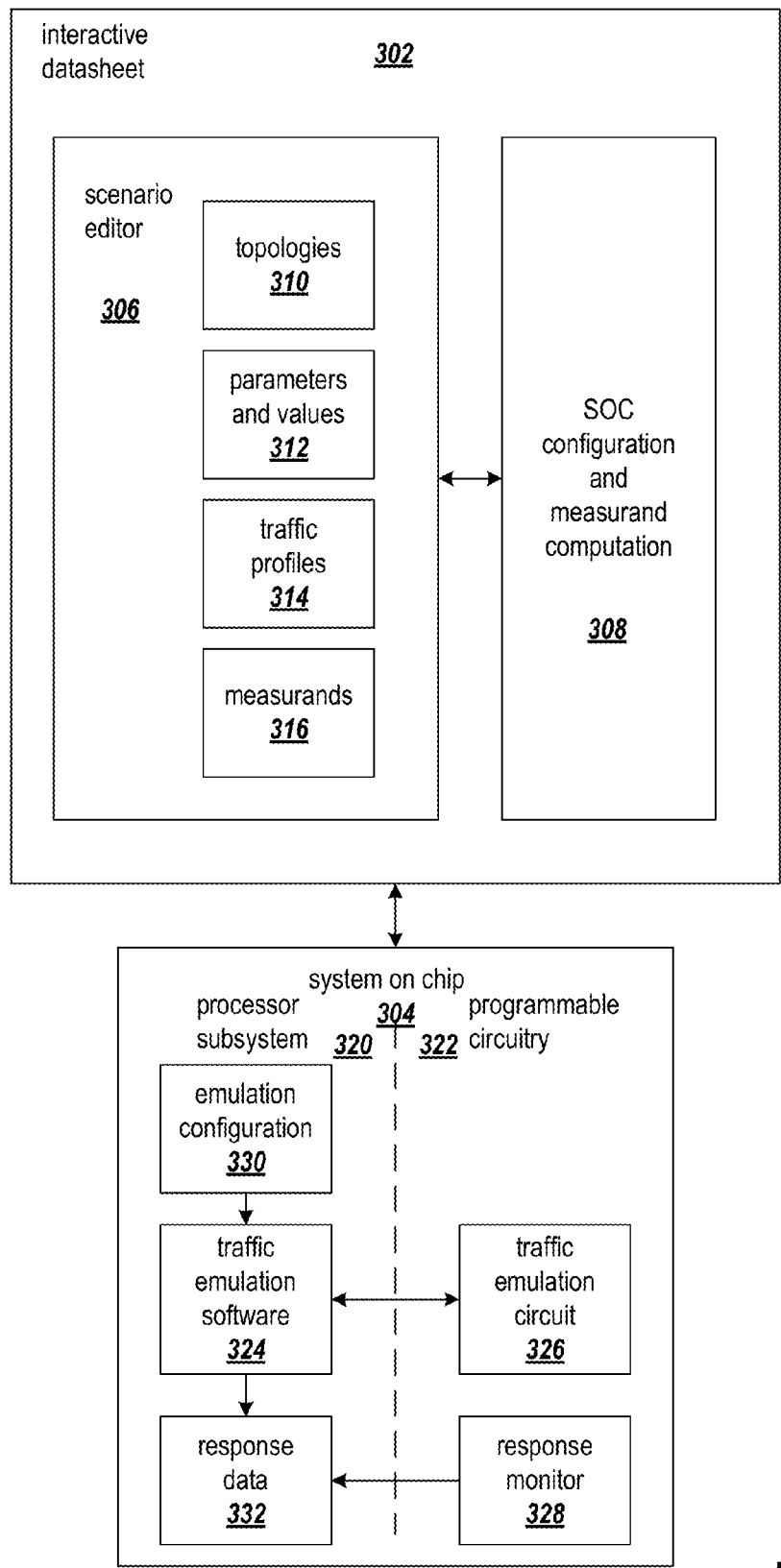
FIG. 3 shows elements of the interactive datasheet and the SOC in an example implementation.

FIG. 3 shows elements of the interactive datasheet 302 and the SOC 304 in an example implementation. The interactive datasheet includes a scenario editor 306 and an element 308 for configuring the SOC and computing measurands. The scenario editor 306 allows the user to specify topology 310, parameter 312, and traffic profile 314 variables to be used in estimating performance of the SOC as reflected in one or more of the measurands 316. The scenario editor 306 also allows selection of the measurands for which values are to be computed and displays the values of the measurands based on the user-specified scenario.

The scenario editor may employ a number of different user input/output methods for editing and viewing the topology, parameter, and traffic profile variables, and selecting and viewing measurands. For example, the data may be selected with drop-down menus, check boxes, buttons, icons, table entries, etc. or entered by typing the data. Similarly, measurands may be displayed as numerical values or as graphical objects such as bar graphs, pie charts, distributions, or plots along an x, y, and z axes, for example.

The SOC configuration and measurand computation component 308 handles configuration of the SOC with the necessary configuration bitstreams and other configuration data for the user-specified scenario. The component also computes measurand values based on the response data gathered from the SOC.

The SOC 304 includes a processor subsystem 320 and programmable circuitry 322. The processor subsystem includes a processor (not shown) for executing emulation software 324. Though not shown, it will be appreciated that the processor subsystem may include one or more DSPs, numeric coprocessors and/or other hardware accelerators. The programmable circuitry 322 includes programmable logic and routing resources (not shown) in which an emulation circuit 326 and a response monitor 328 are implemented. Together, the emulation software and emulation circuit provide stimuli according to the user-specified scenario, which is described in the emulation configuration 330, which contains the topology, parameter, and traffic profile variables. The response monitor generates response data 332, which may also be generated by the emulation software. The measurand computation component 308 of the interactive datasheet reads the response data from the SOC, computes measurand values, and provides the data to the scenario editor for display.

Though not shown, it will be appreciated that the SOC may include additional configurable hardware that may be involved in the emulation and gathering of response data. For example, the SOC may include a graphics processing unit (GPU) and/or other hardwired logic that is dedicated to a particular function, such as audio and video codecs. Some such hardware may have built-in performance measurement units (not shown) that measure performance data during operation and write performance values indicative of the performance data to a shared memory, for example. The performance values may be subsequently read for computing measurand values.

It will be further appreciated that although SOCs are described in terms of a programmable IC having a programmable processor, programmable logic, programmable routing resources, etc., programmable ICs having only a programmable processor and no programmable logic or programmable routing resources, or programmable ICs having programmable logic and programmable routing resources but no programmable processor may be targeted for performance estimation using the teachings of this disclosure.

The interactive datasheet 306 may be executed on a host computer system (not shown) that is coupled to the SOC 304 or on the SOC itself. For example, the scenario editor may execute on the processor subsystem 320 of the SOC being evaluated. Alternatively, the interactive datasheet 306 and SOC may be operated within a client-server system. The user interface may execute on a client computer and communicate with a server computer that is coupled to the client computer via a network. The SOC may be coupled to the server, with the server controlling the configuration of the SOC and reading of response data from the SOC. The user's selections of topology, parameter, and traffic profile variables, along with the desired measurands, are communicated from the client computer to the server computer.

FIGS. 4-8 show examples in which a previously specified scenario with precompiled measurand values is displayed and then modified for dynamically determining new measurand values. Each diagram shows respective curves for latency versus utilization for a combination of read and write requests, read requests only, and write requests only. Though only a limited number of configuration options are shown for ease of exposition, it will be appreciated that an SOC may have hundreds more configuration and measurand options, which would be reflected in the selections presented in the user interface.

Latency may be measured in terms of the time between when an operation is issued and the time when an operation completes. For a read operation, the latency for one operation may be the time from when the read request is issued to the time when the requested data arrives at the requester. The overall read latency may be an average of the latencies for some number of read requests. For a write operation the latency for one operation may be the time from when the write request is issued to the time when an acknowledgement that the write request is complete is received at the requester. The overall write latency may be an average of the latencies for some number of write requests. The read/write latency may be the average of the latencies for a mixture of read and write requests. Utilization may refer to the percentage of a resource that is consumed in a scenario. For example, the utilization may be expressed in terms of the percentage of time that a particular I/O channel is busy during the scenario.

Figure 4:
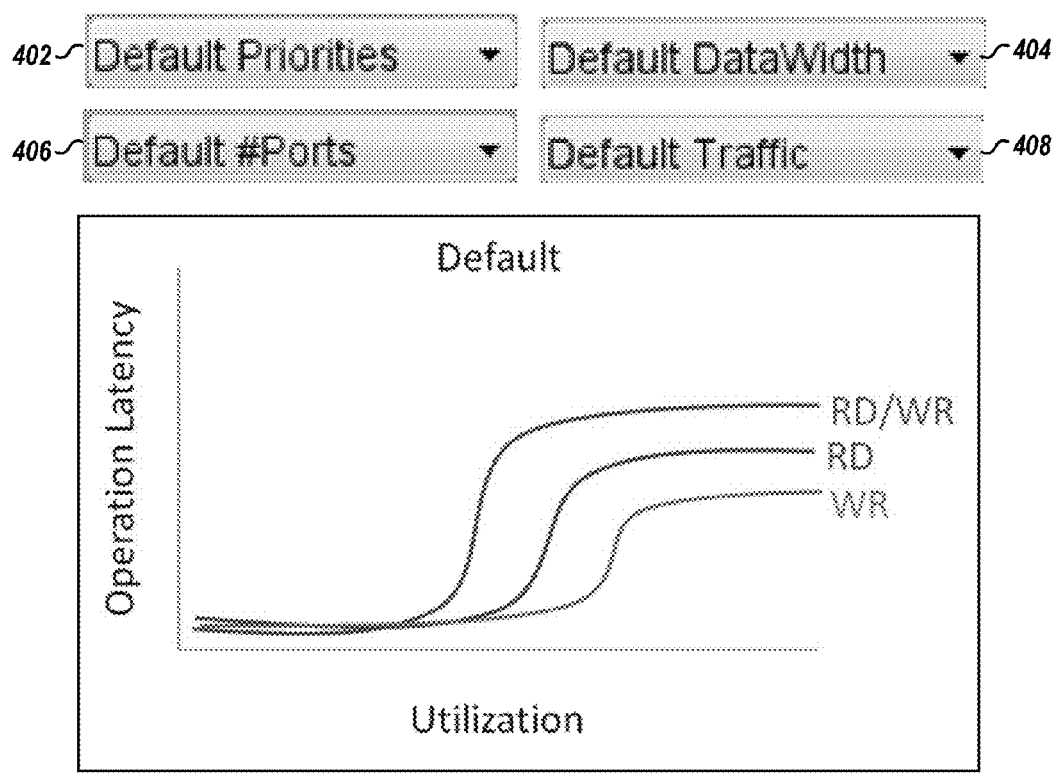
FIG. 4 shows an example user interface in which default values are used for priorities, data width, number of ports, and traffic addressing.

FIG. 4 shows an example user interface in which default values are used for priorities 402, data width 404, number of ports 406, and traffic addressing 408. The priorities 402 and data width 404 correspond to an example subset of the variables for specifying the parameters of a scenario. The number of ports 406 corresponds to an example subset of the variables for specifying the topology of the scenario. The traffic addressing 408 corresponds to an example subset of the variables for specifying the traffic profile of the scenario. The measurands of the scenario include read latency, write latency, and read/write latency. The latencies are displayed as a plot of the latency values versus utilization of a resource of the SOC.

Figure 5:
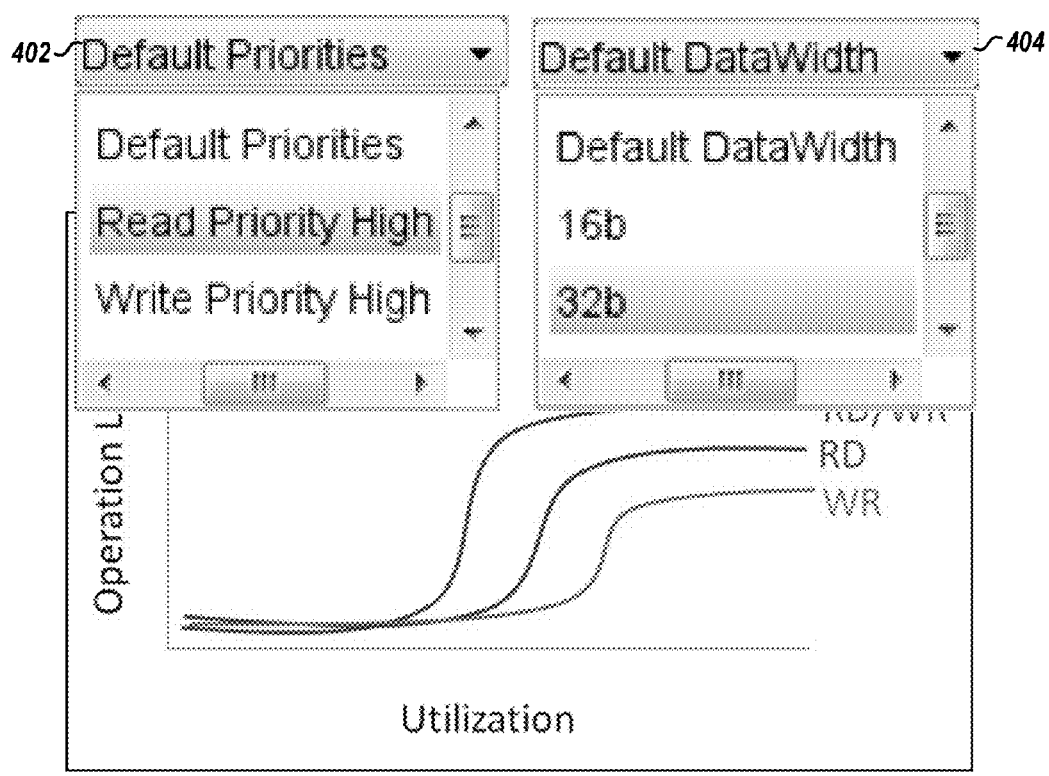
FIG. 5 shows an example user interface in which the variables for the priorities 402 and data width parameters are changed.

FIG. 5 shows an example user interface in which the variables for the priorities 402 and data width 404 parameters are changed. The priorities 402 parameter is designated as Read Priority High, and the data width 404 parameter is designated as 32 bits wide via pull-down menus. The selection of these parameter values changes the default values of the previously specified scenario. The variables for the number of ports 406 and traffic addressing 408 parameters, which are obscured by the pull-down menus, remain with the default values.

Figure 6:
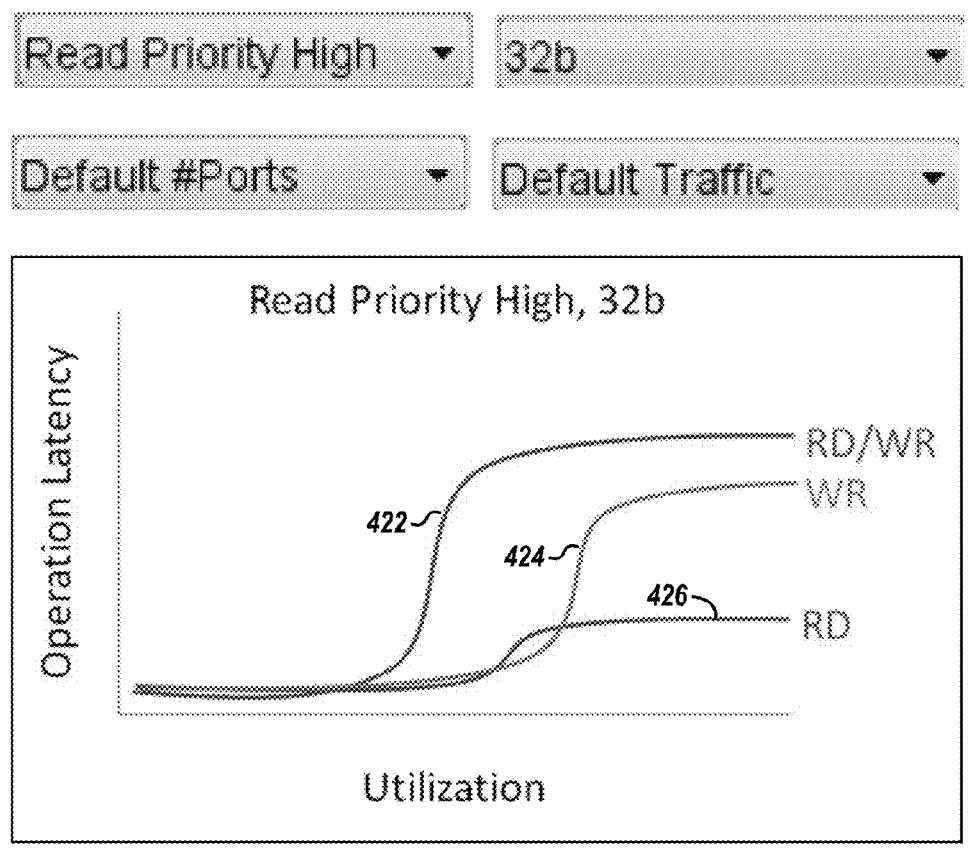
FIG. 6 shows an example user interface in which the Latency-versus-Utilization curves reflect the measurand values resulting from the scenario specified in FIG. 5.

FIG. 6 shows an example user interface in which the Latency-versus-Utilization curves reflect the measurand values resulting from the scenario specified in FIG. 5. Curves 422, 424, and 426 show the changes in measurand values from the corresponding curves shown in FIG. 4.

Figure 7:
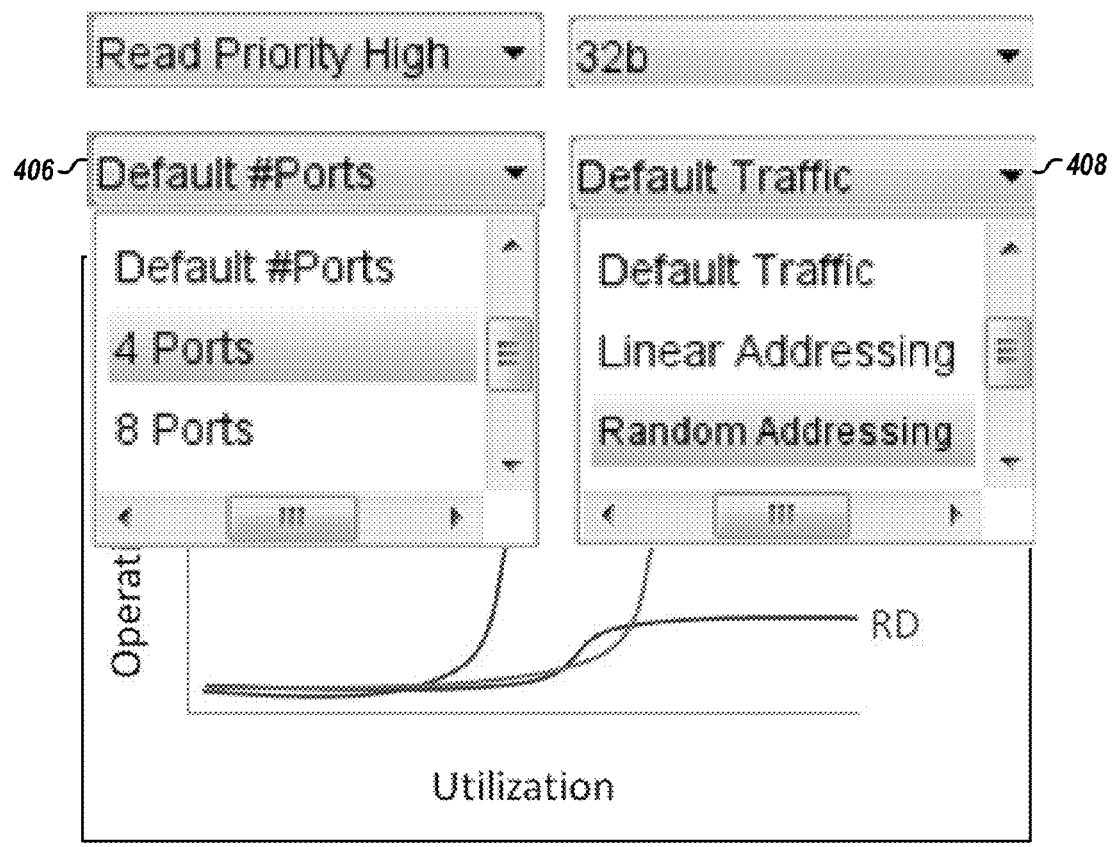
FIG. 7 shows an example user interface in which the variables for the number of ports and the traffic addressing are changed from the default values.

FIG. 7 shows an example user interface in which the variables for the number of ports 406 and the traffic addressing 408 are changed from the default values. The diagram shows the selection of 4 Ports for a variable of the topology and the selection of Random Addressing for a traffic profile variable. The priorities 402 parameter remains designated as Read Priority High, and the data width 404 parameter remains designated as 32 bits wide.

Figure 8:
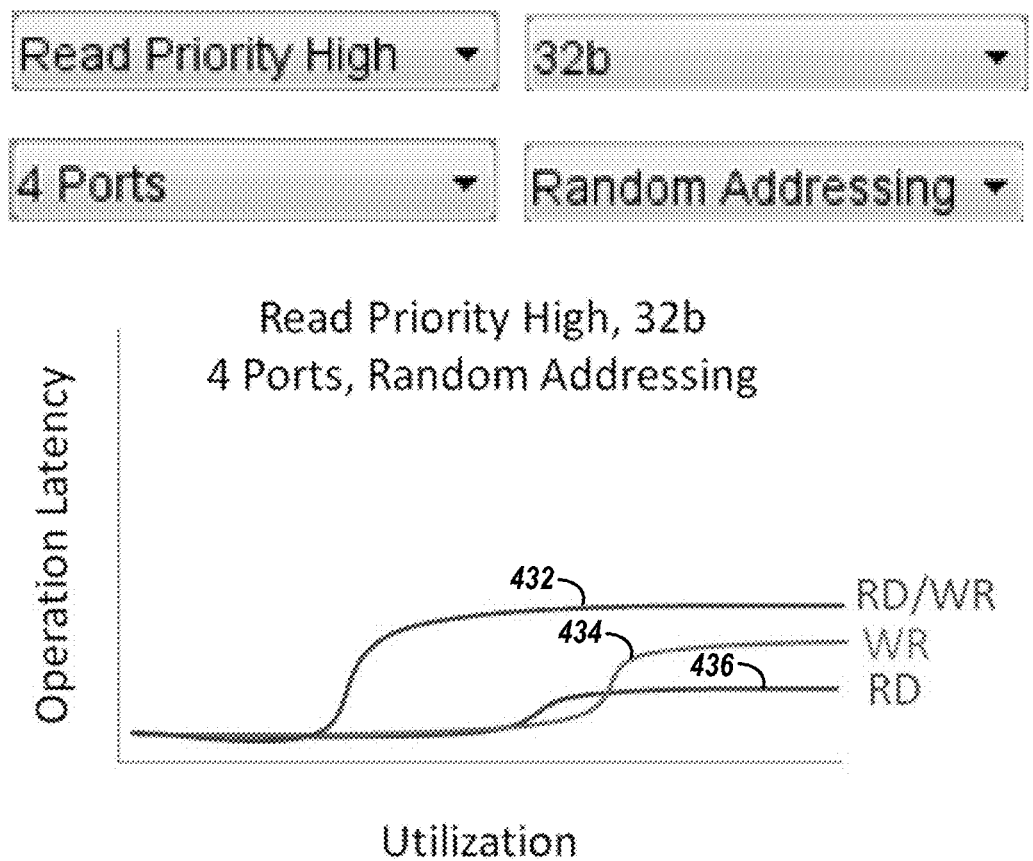
FIG. 8 shows an example user interface in which the Latency-versus-Utilization curves reflect the measurand values resulting from the scenario specified in FIG. 7.

FIG. 8 shows an example user interface in which the Latency-versus-Utilization curves reflect the measurand values resulting from the scenario specified in FIG. 7. Curves 432, 434, and 436 show the changes in measurand values from the corresponding curves shown in FIG. 6.

Figure 9:
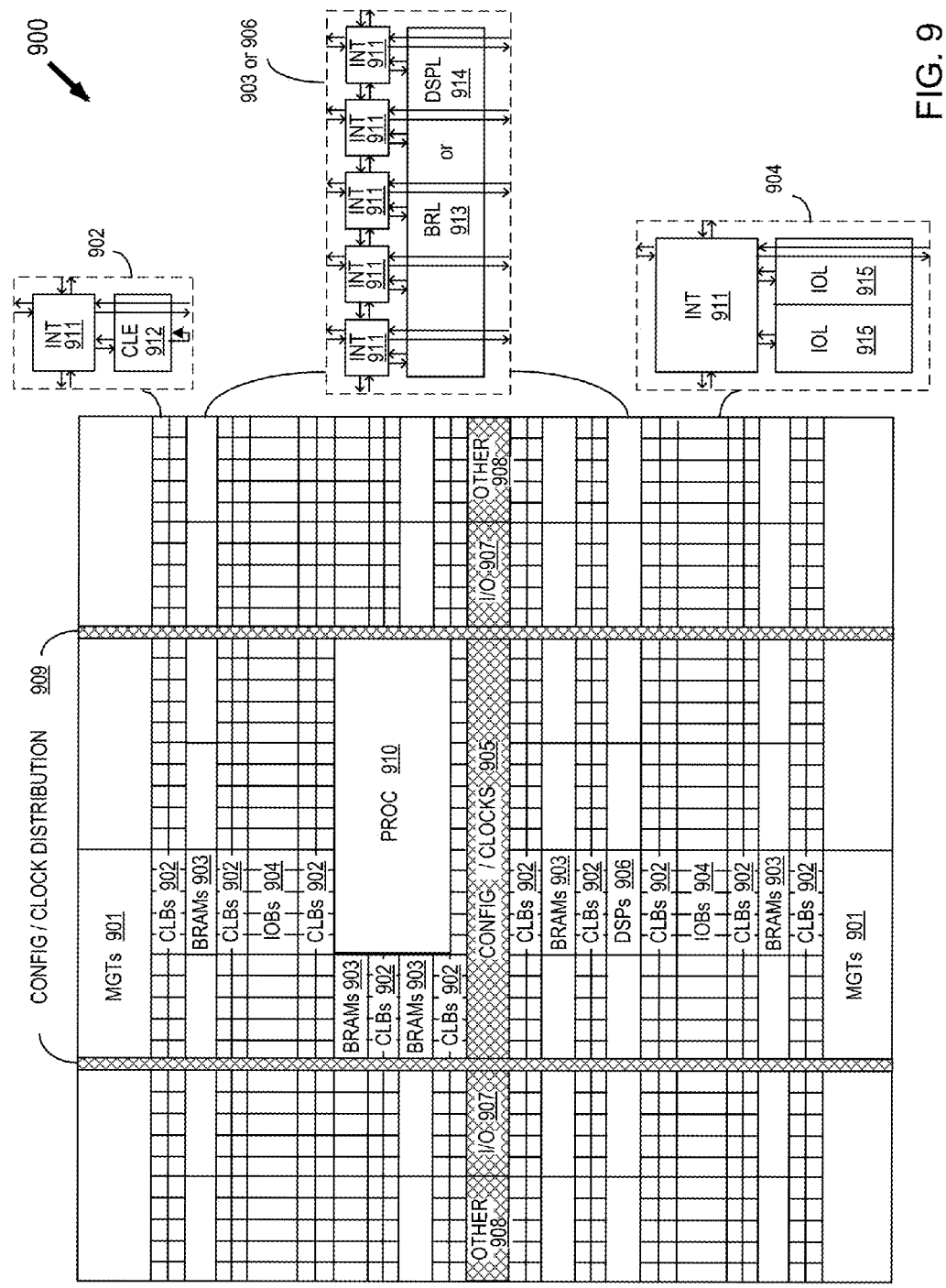
FIG. 9 shows an example SOC that may be used in the methods and systems described herein.

FIG. 9 shows an example SOC 900 that may be used in the methods and systems described herein. The programmable resources of the SOC may be those typically found in an FPGA. FPGAs can include several different types of programmable logic blocks in the array. For example, an FPGA may include a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907), for example, e.g., clock ports, and other programmable logic 908 such as digital clock managers, analog-to-digital converters, system monitoring logic, and so forth. Some FPGAs also include internal and external reconfiguration ports (not shown).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the SOC. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic plus a single programmable interconnect element INT 911. A BRAM 903 can include a BRAM logic element (BRL 913) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element INT 911. As will be clear to those of skill in the art, the actual I/O pads connected, for example, to the I/O logic element 915 are manufactured using metal layered above the various illustrated logic blocks, and typically are not confined to the area of the input/output logic element 915.

In the pictured SOC, a horizontal area near the center of the die (shown shaded in FIG. 9) is used for configuration, clock, and other control logic. Vertical areas 909 extending from this horizontal area are used to distribute the clocks and configuration signals across the breadth of the FPGA.

The SOC 900 may include additional logic blocks that disrupt the regular row structure. The additional logic blocks can be programmable blocks and/or dedicated logic. For example, the processor block PROC 910 shown in FIG. 9 spans several rows of CLBs and BRAMs.

Note that FIG. 9 is intended to illustrate only an exemplary SOC architecture. The number of processor blocks, special-purpose hardwired logic blocks, numbers of logic blocks in a row, the relative heights of the rows, the number and order of rows, the types of logic blocks included in the rows, the relative sizes of the logic blocks, and the interconnect/logic implementations included at the top of FIG. 9 are purely exemplary.

Figure 10:
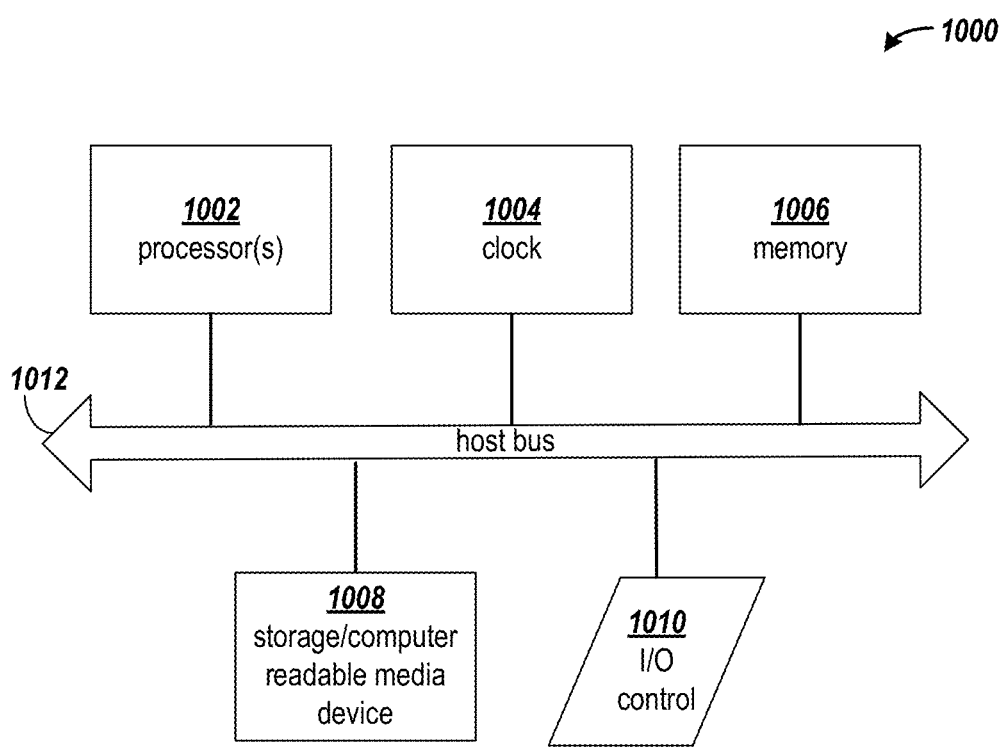
FIG. 10 shows an example computing arrangement on which processes and data structures of the interactive datasheet may be implemented.

FIG. 10 shows an example computing arrangement on which processes and data structures of the interactive datasheet may be implemented. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 1000 includes one or more processors 1002, a clock signal generator 1004, a memory arrangement 1006, a storage arrangement 1008, and an input/output control unit 1010, all coupled to a host bus 1012. The arrangement 1000 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 1002 may be one or more general purpose processors, or a combination of one or more general purpose processors and suitable co-processors, or one or more specialized processors (e.g., RISC, CISC, pipelined, etc.).

The memory arrangement 1006 typically includes multiple levels of cache memory, and a main memory. The storage arrangement 1008 may include local and/or remote persistent storage, such as provided by magnetic disks (not shown), flash, EPROM, or other non-volatile data storage. The storage unit may be read or read/write capable. Further, the memory arrangement 1006 and storage arrangement 1008 may be combined in a single arrangement.

The processor(s) 1002 executes the software in storage arrangement 1008 and/or memory arrangement 1006, reads data from and stores data to the storage arrangement 1008 and/or memory arrangement 1006, and communicates with external devices through the input/output control arrangement 1010. These functions are synchronized by the clock signal generator 1004. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and systems described herein are thought to be applicable to a variety of systems for estimating performance of SOCs. Other aspects and features will be apparent to those skilled in the art from consideration of the specification. It is intended that the specification and illustrated embodiments be considered as examples only, with a true scope of the invention being indicated by the following claims.

What is claimed is:

1. A method of estimating performance of an electronic system on a programmable integrated circuit (IC), comprising:

providing a user interface for selection of a previously specified scenario from a plurality of previously specified scenarios, wherein each previously specified scenario includes a previously specified topology of the electronic system, one or more previously specified parameter values applied to the electronic system, a previously specified traffic profile, and respective precompiled values of a plurality of measurands including at least a read latency and a write latency;

wherein the programmable IC includes a processor and programmable logic resources;

in response to user selection of one of the previously specified scenarios, reading from a database respective precompiled values of the measurands associated with the one scenario and displaying the respective precompiled values of the measurands;

wherein the user interface further provides for specification of a scenario, including specification of a topology of the electronic system, specification of one or more parameter values to apply to the electronic system, specification of a traffic profile, and selection of at least one measurand;

wherein specification of the traffic profile includes specification of a selectable ratio of read transactions and write transactions and a selectable one of a linear addressing mode or a random addressing mode;

in response to user specification of a scenario, configuring traffic emulation circuitry in the programmable IC to execute the specified scenario;

emulating the system with the traffic emulation circuitry configured to execute the specified scenario, the emulating including generating stimuli and measuring responses for determining a value of the at least one measurand;

computing the value of the at least one measurand;

storing the computed value of the at least one measurand in association with the specified scenario in the database; and displaying the computed value of the at least one measurand.

2. The method of claim 1, wherein the programmable IC includes programmable routing resources and memory accessible to the processor and circuitry implemented in the programmable logic resources, and the emulating includes configuring the processor with software that generates traffic according to a traffic profile, and configuring the programmable logic resources and programmable routing resources to generate the stimuli and measure the responses.

3. The method of claim 2, wherein the programmable IC includes a graphics processing unit (GPU), and the emulating includes configuring the GPU with software that generates traffic according to a traffic profile.

4. The method of claim 2, wherein:
the programmable IC includes a hardwired logic block having a performance measurement unit;
the emulating includes generating traffic for processing by the hardwired logic block and reading performance values from the performance measurement unit; and
the computing the value of the at least one measurand includes computing the value as a function of the performance values.

5. The method of claim 1, further comprising:
after the displaying the computed value of the at least one measurand:
changing at least one of the topology, the one or more parameter values, or the traffic profile in response to user input;
reconfiguring the programmable IC with configuration data indicative of the changed at least one of the topology, the one or more parameter values, or the traffic profile;
emulating the system with the emulation circuitry configured with the changed at least one of the topology, the one or more parameter values, or the traffic profile, the emulating including generating stimuli and measuring responses for determining a value of at least one other measurand;
computing the value of the at least one other measurand; and
displaying the value of the at least one other measurand.

6. The method of claim 1, further comprising:
providing the user interface on a host computer; and
wherein the configuring the traffic emulation circuitry in the programmable IC includes configuring the programmable IC by the host computer.

7. The method of claim 1, further comprising:
providing the user interface on a client computer;
communicating the specified topology, the specified one or more parameter values, and the specified traffic profile to a server computer via a network; and
configuring the programmable IC with configuration data stored on the server computer.

8. The method of claim 1, wherein the topology includes a selectable number of ports between the processor and programmable logic resources.

9. The method of claim 1, wherein the plurality of parameters includes selectable priorities for read and write requests and selectable quality of service metrics.

10. The method of claim 1, wherein the measurands further include channel utilization, throughput, and power consumption.

11. The method of claim 1, further comprising:
wherein the user interface further provides a selectable option for revalidating a previously specified scenario;
in response to a user selection to revalidate a previously specified scenario:
configuring traffic emulation circuitry in the programmable IC to execute the previously specified scenario;
emulating the system with the traffic emulation circuitry configured to execute the previously specified scenario, the emulating including generating stimuli and measuring responses for determining a respective value of each measurand of the previously specified scenario;
computing the respective value of each measurand of the previously specified scenario; and
displaying each computed respective value.

12. A system of estimating performance of an electronic system on a programmable integrated circuit (IC), comprising:
an emulation platform including a programmable IC;
one or more processors coupled to the emulation platform;
a memory coupled to the one or more processors, wherein the memory is configured with instructions that when executed by the one or more processors cause the one or more processors to perform operations including:
providing a user interface for selection of a previously specified scenario from a plurality of previously specified scenarios, wherein each previously specified scenario includes a previously specified topology of the electronic system, one or more previously specified parameter values applied to the electronic system, a previously specified traffic profile, and respective precompiled values of a plurality of measurands including at least a read latency and a write latency;
wherein the programmable IC includes a processor and programmable logic resources;
in response to user selection of one of the previously specified scenarios, reading from a database respective precompiled values of the measurands associated with the one scenario and displaying the respective precompiled values of the measurands;
wherein the user interface further provides for specification of a scenario, including specification of a topology of the electronic system, specification of one or more parameter values to apply to the electronic system, specification of a traffic profile, and selection of at least one measurand;
wherein specification of the traffic profile includes specification of a selectable ratio of read transactions and write transactions and a selectable one of a linear addressing mode or a random addressing mode;
configuring, in response to user specification of a scenario, traffic emulation circuitry in the programmable IC to execute the specified scenario;
wherein:
the emulation platform is configured to emulate the system with the traffic emulation circuitry configured to execute the specified scenario, the emulating including generating stimuli and measuring responses for determining a value of the at least one measurand; and the operations performed by the processor further include computing the value of the at least one measurand, storing the computed value of the at least one measurand in association with the specified scenario in the database and outputting the value of the at least one measurand.

13. The system of claim 12, wherein the programmable IC includes one or more general purpose processors, one or more digital signal processors, one or more numeric coprocessors, one or more hardware accelerators, programmable routing resources, and memory accessible to the processor and circuitry implemented in the programmable logic resources, and the emulating includes configuring the processor with software that generates traffic according to a traffic profile, and configuring the programmable logic resources and programmable routing resources to generate the stimuli and measure the responses.

14. The system of claim 13, wherein the programmable IC includes a graphics processing unit (GPU), and the emulating includes configuring the GPU with software that generates traffic according to a traffic profile.

15. The system of claim 13, wherein:
the programmable IC includes a hardwired logic block having a performance measurement unit;
the emulating includes generating traffic for processing by the hardwired logic block and reading performance values from the performance measurement unit; and the computing the value of the at least one measurand includes computing the value as a function of the performance values.

16. The system of claim 12, further comprising an input/output bus directly coupling the processor and the emulation platform.

17. The system of claim 12, wherein:
the one or more processors include a first processor in a client computer and a second processor in a server computer;
the first processor provides the user interface and communicates the specified topology, the specified one or more parameter values, and the specified traffic profile to the second processor via a network; and
operations performed by the second processor include configuring the programmable IC with configuration data stored on the server computer.

18. The method of claim 1, further comprising:
accumulating in the database, a plurality of user-specified scenarios and associated measurand values determined from emulating the plurality of user-specified scenarios, the plurality of user-specified scenarios specified by a plurality of users.

19. The system of claim 12, wherein the memory is further configured with instructions that when executed by the one or more processors cause the one or more processors accumulate in the database, a plurality of user-specified scenarios and associated measurand values determined from emulating the plurality of user-specified scenarios, the plurality of user-specified scenarios specified by a plurality of users.

* * * * *